United States Patent [19]

Ohashi

[11] 4,186,360
[45] Jan. 29, 1980

[54] DIGITAL CHANNEL SELECTING APPARATUS

[75] Inventor: Tadamasa Ohashi, Takatsuki, Japan

[73] Assignee: Sanyo Electric Co., Ltd., Osaka, Japan

[21] Appl. No.: 879,510

[22] Filed: Feb. 21, 1978

[30] Foreign Application Priority Data

Feb. 18, 1977 [JP] Japan .................................. 52-18519
Mar. 1, 1977 [JP] Japan .................................. 52/22931

[51] Int. Cl.$^2$ .......................... H03J 3/20; H03J 3/06; H03J 5/02; H04B 1/06
[52] U.S. Cl. .......................................... 334/55; 334/15; 334/51; 325/459; 325/465
[58] Field of Search ....................... 334/11, 45, 47, 49, 334/50, 51, 55, 56, 15; 325/459, 461, 462, 464, 465

[56] References Cited

U.S. PATENT DOCUMENTS 3,528,044 9/1970 Manicki .................................. 334/15

FOREIGN PATENT DOCUMENTS 46-41482 7/1971 Japan ............................................ 334/45
46-42402 7/1971 Japan ............................................ 334/15
563788 8/1944 United Kingdom ....................... 334/55
483768 12/1975 U.S.S.R. .................................... 334/55

Primary Examiner—Alfred E. Smith
Assistant Examiner—Harry E. Barlow
Attorney, Agent, or Firm—Armstrong, Nikaido, Marmelstein & Kubovcik

[57] ABSTRACT

A digital channel selecting apparatus for selecting a channel among a plurality of channels which are distributed in at least a relatively higher and lower frequency regions, wherein a plurality of capacitance elements are coupled in parallel, each constituting a portion of a tuning circuit, such that each capacitance element is individually coupled to a corresponding switching device which is operable responsive to a digital control signal, whereby the total capacitance value associated with the tuning circuit is varied to achieve channel selection, characterized in that a fixed reactance component, such as a fixed inductance component or a fixed capacitance component commonly coupled to said plurality of capacitance elements for constituting the tuning circuit is selectively switched to a different reactance value in a semifixed manner by means of a switching diode for each of the higher and lower frequency regions.

17 Claims, 9 Drawing Figures

FIG. 5
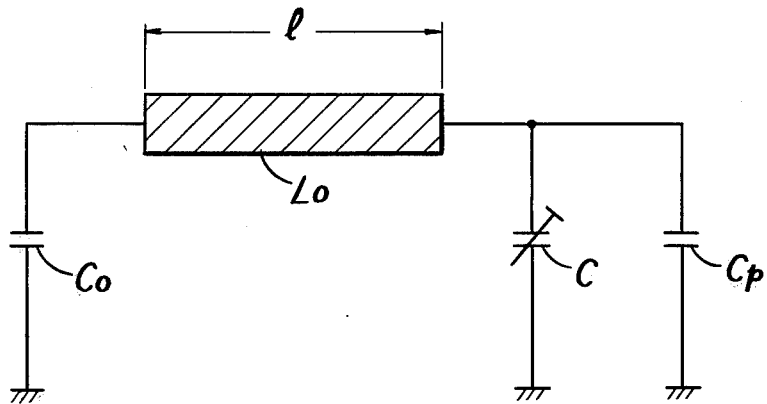
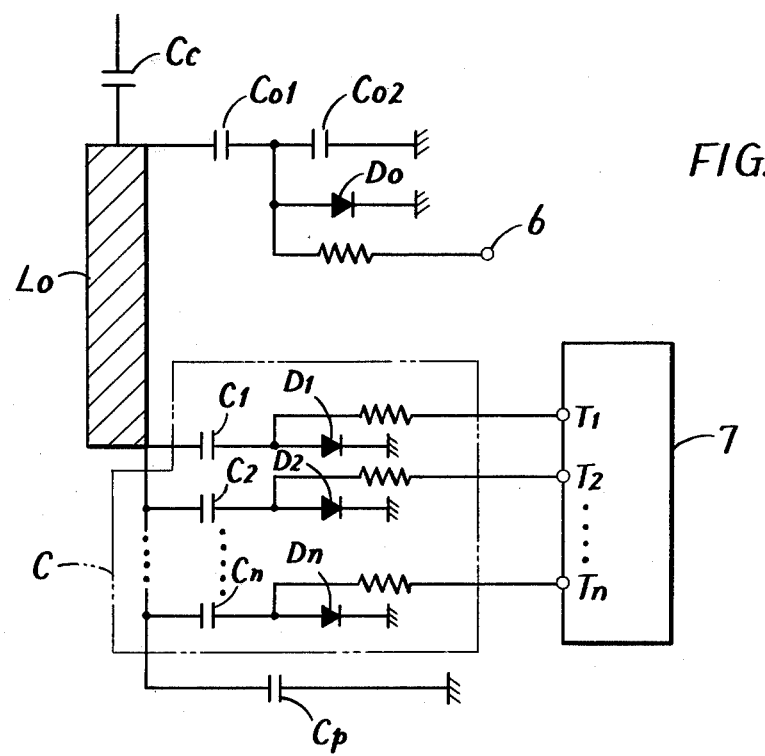
FIG. 6

DIGITAL CHANNEL SELECTING APPARATUS

BACKGROUND OF THE INVENTION

1. Field of the Invention

The present invention relates to a digital channel selecting apparatus. More specifically, the present invention relates to a digital channel selecting apparatus, wherein a plurality of capacitance elements are coupled in parallel, each constituting a portion of a tuning circuit, such that each capacitance element is individually coupled to a corresponding switching device which is operable responsive to a digital control signal, whereby the total capacitance value associated with the tuning circuit is varied to achieve channel selection.

2. Description of the Prior Art

FIG. 1 is a block diagram showing an outline of a tuner or a channel selecting apparatus 1 for use in a typical television receiver. As well known, the tuner 1 comprises an input tuning circuit 2, an inter-stage tuning circuit 3, a local oscillator 4 and a mixer 5 for mixing the high frequency signal from the inter-stage tuning circuit 3 with the local oscillation signal from the local oscillator 4 to provide an intermediate frequency signal through superheterodyne detection.

In a channel selecting operation by means of the tuner 1, the input tuning circuit 2, the inter-stage tuning circuit 3 and the tuning circuit included in the local oscillator 4 must be varied to a desired tuning frequency determinable depending on the channel to be selected. In general, a typical scheme so far adopted for varying the tuning frequency of a tuning circuit is to vary a reverse bias voltage to be applied to a voltage controlled variable capacitance diode coupled in the tuning circuit, thereby to vary the capacitance across the diode and hence to vary the tuning frequency of the tuning circuit.

Recently, a variable capacitance device comprising a plurality of series connections coupled in parallel with each other each including a capacitance element and a switching diode was developed. In using such variable capacitance device, the same is connected such that the total capacitance is varied by selectively applying a digital control signal to each of the switching diode, thereby to select a desired capacitance element. Thus, such variable capacitance device could be advantageously utilized for the purpose of implementing a tuning circuit. FIG. 2 shows a schematic diagram of such a tuning circuit that could be implemented using the above described variable capacitance device comprising a plurality of series connections coupled in parallel with each other each including a capacitance element and a swtiching diode. It is needless to say that such a tuning circuit as shown in FIG. 2 may be employed as the input tuning circuit 2, the inter-stage tuning circuit 3, and the tuning circuit included in the local oscillator 4 shown in FIG. 1, for example.

FIG. 2 shows an example of a tuning circuit for use in a very high frequency or VHF application. Thus, the VHF tuning circuit shown comprises series connected coupling capacitors 9 and 10, an inductance coil L coupled in parallel between these couping capacitors 9 and 10 and the above described variable capacitance device C coupled in parallel between these capacitors 9 and 10. The variable capacitance device C comprises a plurality of capacitance elements $C_1, C_2, C_3 \ldots C_{n-1}$ and $C_n$, and a corresponding plurality of switching diodes $D_1, D_2, D_3, \ldots D_{n-1}$ and $D_n$, each connected in series with the corresponding one of the above described capacitance elements $C_1, C_2, C_3, \ldots C_{n-1}$ and $C_n$, respectively, thereby to constitute a corresponding plurality of series connections in parallel with each other, each including a capacitance element and a switching diode. The junctions of the respective series connections are coupled through corresponding resistors $R_1, R_2, R_3, \ldots R_{n-1}$ and $R_n$ to output terminals $T_1, T_2, T_3, \ldots T_{n-1}$ and $T_n$, respectively, of a digital signal generator 7. The switching diodes $D_1, D_2, D_3, \ldots D_{n-1}$ and $D_n$ are each responsive to the corresponding individual digital control signal from the digital signal generator 7 to be rendered conductive, whereby the capacitance element coupled to the switching diode now rendered conductive is rendered effective or selected as a capacitance to constitute a portion of the tuning circuit as desired. For the purpose of facility of understanding, assuming that only the switching diodes $D_1$ and $D_2$ are selected as a function of the control signals from the digital signal generator 7, the total capacitance of the variable capacitance device C can be simply calculated as $(C_1+C_2)$. Thus, the total capacitance of the variable capacitance device C can be varied in a digital manner or a stepwise manner as a function of the digital control signal.

FIG. 3 shows an example wherein the above described variable capacitance device C is utilized coupled to a ½ wave length resonance type tuning circuit in a ultra high frequency or UHF application. Again it is pointed out that the above described variable capacitance device C could be advantageously utilized as a portion of a tuning circuit in a UHF application as well. As well known, the fundamental circuit of a ½ wave length resonance type tuning circuit comprises a resonance conductor both ends of which are each coupled through a capacitance device to the ground. It would be seen that in the FIG. 3 example a capacitance device coupled to one end of the resonance conductor has been replaced by the above described variable capacitance device C as discussed with reference to FIG. 2. More specifically, one end of a resonance conductor L0 serving as an inductance element is coupled through the above described variable capacitance device C to the ground, while the other end of the resonance conductor L0 is coupled through a fixed capacitance device C0 to the ground.

Similarly, FIG. 4 shows an example of a ¼ wave length resonance type tuning circuit employing the above described variable capacitance device C for use in a UHF application. Again, it is pointed out that FIG. 4 merely shows an example wherein the above described variable capacitance device C has been shown as theoretically applicable to the said application. The fundamental circuit of a ¼ wave length resonance type tuning circuit comprises a resonance conductor, one end of which is directly grounded and the other end of which is coupled through a capacitance device to the ground. The tuning circuit shown in FIG. 4 is shown as the other end of the resonance conductor being connected through the above described variable capacitance device C to the ground in place of an ordinary capacitance device.

It is pointed out that although various examples of application of the above described variable capacitance device C as a tuning circuit component have been shown in FIGS. 2 through 4 these were depicted as merely theoretically applicable. In practicing such examples in actuality, however, various problems would be encountered, as to be more fully discussed in the following. At the outset, with such a digital channel selecting apparatus as discussed with reference to FIGS. 2 through 4, the tuning frequency can be only adjusted in a stepwise manner with a small frequency change $\Delta f$ for each small change $\Delta C$ of the capacitance attained by the variable capacitance device, which could leave a slight frequency deviation $\Delta f0$ with respect to a desired or normal frequency f0, even when a tuning state is established. No problem would occur within the range where such frequency deviation or drift is allowed. Thus, the minimum required capacitance change $\Delta C0min$ of the above described variable capacitance device is determined with respect to the maximum allowable frequency deviation or drift $\Delta f0max$ which is determinable from the stand point of the tuning circuit operation. It is pointed out that the above described minimum required capacitance change $\Delta C0min$ indicates a width with which the capacitance of the variable tuning capacitance device is varied in a stepwise manner or in a digital manner. Accordingly, the minimum unit of the respective capacitance of a plurality of tuning capacitance elements coupled in parallel with each other of the variable capacitance device must be smaller than at least the above described minimum required capacitance change $\Delta C0min$. The reason is that the capacitance of each of a plurality of tuning capacitance elements coupled in parallel with each other of the variable capacitance device is determined as a total sum of the capacitance value of each elements. Thus, the broader the frequency region to be covered by the tuning circuit, the smaller the minimum required capacitance change $\Delta C0min$ for the above described maximum allowable frequency deviation $\Delta f0max$. The reason is that since the parallel resonant frequency f is generally determined by the equation $$f = \frac{1}{2\pi\sqrt{LC}},$$

assuming that resistance of a coil is neglected, the higher the frequency region of the resonance frequency f of the tuning circuit, the smaller the capacitance of the variable capacitance device and accordingly the smaller the required capacitance change $\Delta C0$ for the allowable frequency deviation $\Delta f0$ in such a higher frequency region of the resonance frequency f. Thus, the required capacitance change for the allowable frequency devitation in the maximum frequency of such a higher region becomes the minimum required capacitance change $\Delta C0min$.

Since the minimum unit of the respective capacitance of a plurality of tuning capacitance elements coupled in parallel with each other of the variable capacitance device must be smaller than at least the minimum required capacitance change $\Delta C0min$, as thus described, the broader the frequency region to be covered by the tuning circuit, the smaller the minimum required capacitance change $\Delta C0min$, with the result that the respective capacitance elements constituting the variable capacitance device would be of an extremely small capacitance value. As a result, implementation of a channel selecting apparatus so as to cover all the channels using a plurality of tuning capacitance elements thus selected increases the number of tuning capacitance elements, which makes fabrication of the apparatus difficult. In addition, assuming that such capacitance elements are fabricated in an extremely small capacitance value by means of a thick film or thin film process, there is a limit to the resolution of the capacitance, which causes a problem as compared with a case where a conventional channel selecting apparatus using a voltage controlled variable capacitance diode exhibiting a linear characteristic is employed.

In order to more specifically describe such a problem, the tuning circuit shown in FIG. 3 is more specifically considered. For facility of explanation, the equivalent circuit of the FIG. 3 example is shown in FIG. 5. Referring to FIG. 5, a variable capacitance C denotes a composite capacitance of the capacitance of the capacitance elements C1, C2, C3, ... Cn−1 and Cn shown in FIG. 3 and the resonance conductor L0 is shown as having the total length l. Referring to the FIG. 5 equivalent circuit, assuming the characteristic impedance of the tuning circuit to be Z0 and the frequency to be f, then the total capacitance $C_D$ of the tuning circuit may be expressed by the following equation.

$$C_D = \frac{1}{2\pi f} \times (1 + \frac{\tan\frac{2\pi f}{c} l}{2\pi f C_0 Z_0}) \times \frac{1}{\tan\frac{2\pi f}{c} l - \frac{1}{2\pi f C_0 Z_0}} - C_p$$

Now assuming that l=0.006 m, Z0=215 Ω, C0=30 pF and Cp=5.5 pF, the relation between the required capacitance and the frequency and the relation between the frequency deviation $\Delta f$ (in this case, the deviation of ±0.5 MHz) and the required capacitance change $\Delta C$ are shown in the following Table I. It is pointed out that the frequency deviation $\Delta f$ has been selected to be ±0.5 MHz, because the maximum frequency deviation that can be corrected by means of an automatic frequency control in an ordinary television receiver is approximately ±0.5 MHz.

As seen from Table I, the minimum capacitance change $\Delta C0min$ in case of the frequency deviation ±0.5 MHz is approximately 0.01 pF in case of reception of the signal 894.15 MHz. Accordingly, it is required that the minimum capacitance value of the respective capacitance elements C1, C2, C3, ... Cn−1 and Cn be smaller than 0.01 pF and nevertheless a combination of such capacitance elements must cover the maximum value of the capacitance $C_D$ obtained by the above described equation, i.e., approximately 40 pF for the frequency 510.15 MHz. However, it would be appreciated that in order

TABLE I

| f (MHz) | $C_D$(pF) | Capacitance Change (pF) in case of Frequency Deviation ± 0.5MHz |
|---|---|---|
| 510.15 | 39.607 | + 0.22038 |
|  |  | − 0.22232 |
| 542.15 | 23.570 | + 0.13377 |
|  |  | − 0.13470 |
| 582.15 | 20.176 | + 0.8168 |
|  |  | − 0.08212 |
| 622.15 | 14.813 | + 0.05467 |
|  |  | − 0.05493 |
| 662.15 | 11.111 | + 0.03895 |
|  |  | − 0.03910 |
| 702.15 | 3.415 | + 0.02901 |
|  |  | − 0.02911 |
| 742.15 | 6.374 | + 0.02234 |
|  |  | − 0.02241 |
| 782.15 | 4.781 | + 0.01766 |
|  |  | − 0.01772 |
| 822.15 | 3.509 | + 0.01427 |

TABLE I-continued

| f (MHz) | $C_D$(pF) | Capacitance Change (pF) in case of Frequency Deviation ± 0.5MHz |
|---|---|---|
| 862.15 | 2.472 | − 0.01431 |
|  |  | + 0.01173 |
|  |  | − 0.01175 |
| 894.15 | 1.778 | + 0.01013 |
|  |  | − 0.01015 | to vary in a stepwise manner or in a digital manner the capacitance with a variation width of 0.01 pF, it is extremely difficult to implement the capacitance elements C1, C2, C3, ... Cn−1 and Cn so as to satisfy the total capacitance of 40 pF. For the purpose of description of the present invention in the specification, a stepwise or digital variation of the capacitance with a variation width of say 0.01 pF is defined as "a resolution of 0.01/step". Even if such a voltage controlled variable capacitance device including a plurality of capacitance elements coupled in parallel with each other could be implemented such that the capacitance of each capacitance element is as small as 0.01 pF, the total capacitance value of 40 pF required as described above entails an increased number of capacitance elements and hence an increased number of bits of the digital control signal, which makes undesirably complicated the channel selecting apparatus.

In order to solve the above described problems, it could be considered that a variable capacitance range of the variable capacitance device is confined to a limited narrow range and a broader frequency region is covered by selectively switching an additional reactance device of the tuning circuit, thereby to cover the desired range of the frequency using such a variable capacitance device either with or without such an additional reactance device. A typical prior art for selectively switching such additional reactance device in a tuning circuit has been known in a circuit configuration where a voltage controlled variable capacitance device combined with an inductance for achieving a relatively narrow capacitance variation region is used to cover a high frequency region, without an additional inductance element, and to cover a lower frequency region, with such additional inductance element, such that a variation range is selectively shifted among the higher and lower frequency regions. However, such a prior art system for selectively shifting a relatively narrow variation range among the higher and lower frequency regions merely employs a voltage controlled variable capacitance device of a given narrow variation capacitance range and such a prior art system is different from the tuning circuit as discussed with reference to FIGS. 2 through 4, wherein a different combination of the respective capacitance elements of a variable capacitance device C is adapted to cover all the frequency regions of both the high and low frequency regions, for example. It is pointed out that the present invention is directed to an improvement in a tuning circuit using a variable capacitance device C as discussed with reference to FIGS. 2 through 4, wherein a combination of the respective capacitance elements is selectively switched to cover all the frequency regions of both the high and low frequency regions, for example, by different combination of these capacitance elements.

SUMMARY OF THE INVENTION

Briefly described, the present invention comprises a digital channel selecting apparatus for selecting a channel among a plurality of channels which are distributed in at least a higher and lower frequency regions, comprising a tuning circuit including reactance consisting of a fixed reactance component and a variable reactance component, said variable reactance component including a plurality of capacitance elements coupled in parallel with each other, a plurality of switching devices individually coupled to said plurality of capacitance elements for individually and selectively rendering effective said plurality of capacitance elements, a selection circuit for generating a coded digital control signal for selectively enabling said plurality of switching devices so as to achieve a tuning state by said tuning circuit through selective rendering effective of said plurality of capacitance elements corresponding to a channel to be selected, and means for varying in a semifixed manner the reactance value of said fixed reactance component in said tuning circuit for each of at least said higher and lower frequency regions.

In a preferred embodiment of the present invention, the capacitance values of said plurality of capacitance elements may be weighted in a predetermined relation, if desired, although such weighting is not necessarily required.

In a further preferred embodiment of the present invention, variation of the reactance value of said fixed reactance component by means of said fixed reactance value varying means is achieved by switching an inductance element or a capacitance element constituting said fixed reactance component.

Preferably, the said tuning circuit may be implemented by a ½ wave length resonance type tuning circuit for UHF application in a television receiver. In such an embodiment, the inductance element constituting the said fixed reactance component can be implemented by a resonance conductor, wherein one end thereof is coupled through said variable reactance component inluding the parallel connection of said plurality of capacitance elements to the ground and the other end thereof is coupled to a capacitance element constituting said fixed reactance component.

In a further preferred embodiment of the present invention, the said tuning circuit may be implemented by a ¼ wave length resonance type tuning circuit for UHF application in a television receiver. The said fixed reactance component in said tuning circuit may be implemented by a resonance conductor, wherein one end thereof is grounded while the other end thereof is connected through said variable reactance component including the parallel connection of said plurality of capacitance elements to the ground.

In still a further preferred embodiment of the present invention, the said plurality of capacitance elements are divided into a plurality of groups individually associated with at least said higher and lower frequency regions, and the capacitance value of the minimum tuning capacitance element in the respective groups is different from group to group. The capacitance elements other than said minimum tuning capacitance elements in the respective groups is selected to be in a predetermined digital relation with said minimum tuning capacitance elements of the said respective groups.

Accordingly, a principal object of the present invention is to provide a digital channel selecting apparatus comprising a variable capacitance device including a plurality of capacitance elements coupled in parallel with each other and a plurality of switching diodes operable responsive to a digital control signal each individually coupled to said plurality of capacitance elements, wherein the requirement of resolution of said plurality of capacitance elements is mitigated.

Another object of the present invention is to provide a digital channel selecting apparatus comprising a variable capacitance device including a plurality of capacitive elements coupled in parallel with each other and a plurality of switching diodes operable responsive to a digital control signal each individually coupled to said plurality of capacitance elements, wherein a capacitance element other than those capacitance elements constituting said variable capacitance device or an inductance element of a tuning circuit is adapted to be switched for each of a plurality of frequency regions.

A further object of the present invention is to provide a digital channel selecting apparatus comprising a variable capacitance device including a plurality of capacitance elements coupled in parallel with each other and a plurality of switching diodes operable responsive to a digital control signal each individually coupled to said plurality of capacitance elements, wherein the number of said capacitance elements constituting said variable capacitance device is decreased, whereby the number of bits of said digital control signal required for channel selection is decreased as much as possible.

These objects and other objects, features, aspects and advantages of the present invention will become more apparent from the following detailed description of the present invention when taken inconjunction with the accompanying drawings.

BRIEF DESCRIPTION OF THE DRAWINGS

FIG. 5 shows an equivalent circuit of the FIG. 3 diagram;

FIG. 6 is a schematic diagram of one embodiment of a ½ wave length resonance type tuning circuit in accordance with the present invention;

DESCRIPTION OF THE PREFERRED EMBODIMENTS

Figure 3:
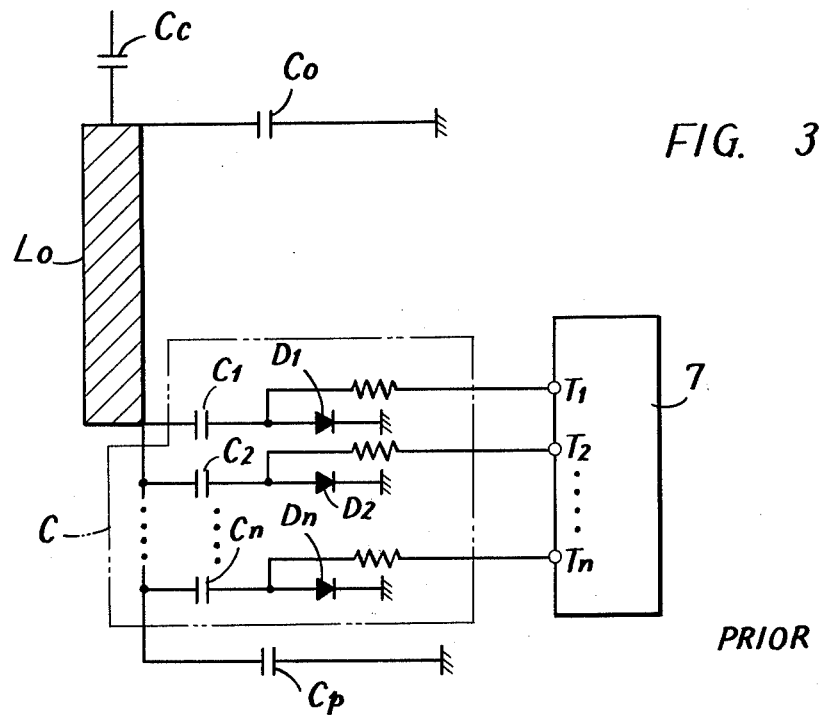
FIG. 3 is an example of a ½ wave length resonance type tuning circuit in UHF application that constitutes the background of the present invention and can be theoretically conceived.

FIG. 6 shows a schematic diagram of a ½ wave length resonance type tuning circuit for UHF reception of one embodiment of the present invention. The FIG. 6 diagram is similar to the FIG. 3 diagram, except for the following modifications. Hence, such modified portions will be described in the following. A major modification in the FIG. 6 diagram, as compared with the FIG. 3 diagram, is that one end of the resonant conductor L0 is coupled through a series connection of capacitors C01 and C02, in place of the capacitor C0 in the FIG. 3 diagram, to the ground, and the junction between the capacitors C01 and C02 is coupled through a switching diode D0 to the ground, with the polarity shown, while the said junction is coupled through a resistor to a terminal 6 for receiving a switching control voltage. The terminal 6 is connected to receive a switching control voltage, switchable between two levels for selectively rendering the switching diodes D0 conductive or non-conductive for the purpose of selecting two frequency regions, i.e., a higher frequency region and a lower frequency region. In the embodiment shown, in order to select the higher frequency region, a switching control voltage signal for reverse biasing the diode D0 is applied to the terminal 6, thereby to render the diode D0 non-conductive to make effective the capacitor C02 and, in order to select the lower frequency region, a switching control voltage signal for forward biasing the diode D0 is applied to the terminal 6, thereby to render the diode D0 conductive to make ineffective the capacitor C02. As a result, when the higher frequency region is to be selected, both capacitors C01 and C02 are rendered effective, while when the lower frequency region is to be selected, only the capacitor C01 is rendered effective as a tuning component and the capacitor C02 is rendered ineffective or is removed from the tuning circuit because of conduction of the diode D0. Thus, according to the present invention, the capacitance value of the fixed capacitor C0 shown in the FIG. 3 diagram is switched such that the capacitance value becomes large when the lower frequency region is to be selected and the capacitance value becomes small when the higher frequency region is to be selected, whereby in accordnace with the equation of $C_D$ previously shown the variation range of the capacitance $C_D$ corresponding to the lower frequency region and the variation range of the capacitance $C_D$ corresponding to the higher frequency region are made substantially equal to each other. For clearer and better understanding of such effect of the present invention, exemplary data in conjunction with the FIG. 6 embodiment based on the FIG. 5 equivalent circuit is shown in Table II. It is pointed out that in Table II it has been assumed that $l=0.006$ m, $Z0=215$ Ω, and $Cp=10$ pF, and $C0=65$ pF for the lower frequency region and $C0=16$ pF for the higher frequency region.

TABLE II

| | f (MHz) | $C_D$(pF) | Capacitance Variation (pF) in case of frequency deviation ± 0.5 MHz |
|---|---|---|---|
| | 510.15 | 24.705 | + 0.10420 |
| | | | − 0.10471 |
| | 542.15 | 18.953 | + 0.07711 |
| lower frequency region | | | − 0.07743 |

TABLE II-continued

| | f (MHz) | $C_D$(pF) | Capacitance Variation (pF) in case of frequency deviation ± 0.5 MHz |
|---|---|---|---|
| | 532.15 | 13.708 | + 0.05553 |
| | | | − 0.05575 |
| | 622.15 | 9.847 | + 0.04164 |
| | | | − 0.04177 |
| | 662.15 | 6.911 | + 0.03220 |
| | | | − 0.03229 |
| | 702.15 | 4.614 | + 0.02551 |
| | | | − 0.02558 |
| | 742.15 | 22.164 | + 0.12981 |
| | | | − 0.18083 |
| higher frequency region | 782.15 | 14.129 | + 0.07712 |
| | | | − 0.07756 |
| | 822.15 | 9.103 | + 0.05086 |
| | | | − 0.05112 |
| | 862.15 | 5.673 | + 0.03596 |
| | | | − 0.03609 |
| | 894.15 | 3.630 | + 0.02822 |
| | | | − 0.02831 |

It is seen from Table II that the resolution, as previously defined, of the capacitance elements C1, C2, C3, ... Cn−1 and Cn may be approximately 0.025 pF and the total capacitance of the tuning circuit may be approximately 24 pF at the largest. The reason is that in Table II the minimum capacitance value is 0.0251 pF in case where the receiving frequency 702.15 MHz is deviated by +0.5 MHz and the capacitance value for one of the capacitance elements C1, C2, C3, ... Cn−1 and Cn may be 0.025 pF, in which case the maximum capacitance value $C_D$ attained by combination of the capacitance elements thus selected may be approximately 24 pF since $C_D$=24.705 pF in case of the receiving frequency of 510.15 MHz. The capacitance value $C_D$ can be further reduced to a smaller value of approximately 22 pF in case where the capacitance value Cp is selected to be 12 pF, i.e., Cp=12 pF.

Meanwhile, the capacitance values of the capacitors C1, C2, C3, ... Cn−1 and Cn constituting the variable capacitance device C may be weighted in a predetermined relation. Alternatively the capacitance values of these capacitors each may be the same capacitance value based on the above described minimum resolution.

The digital signal generator 7 is structured such that a coded digital control signal coded in advance so as to correspond to a station or channel to be selected is obtained at the output terminals T1 through Tn, whereby the capacitors C1 though Cn as weighted or not weighted are selectively rendered effective to determine a composite capacitance value of the above described variable capacitance device C. Accordingly, the composite capacitance value of the variable capacitance device C is to be varied in a stepwise manner or in a digital manner responsive to the coded digital control signal from the digital signal generator 7.

Figure 4:
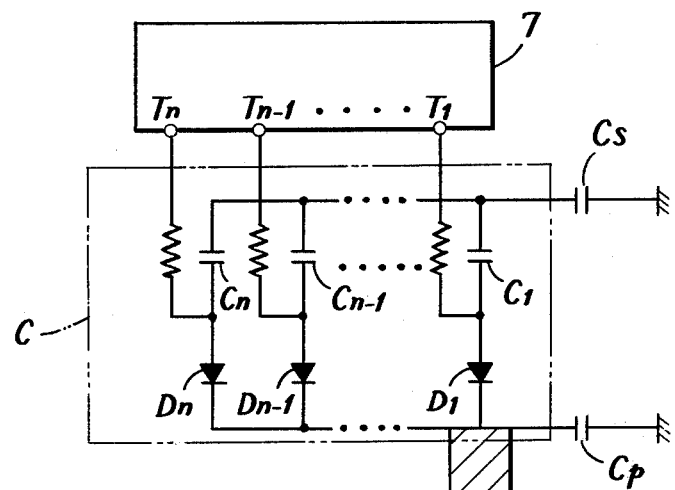
FIG. 4 is similar to FIG. 3 but shows a schematic diagram of an example of a ¼ wave length resonance type tuning circuit in a UHF application.
Figure 7:
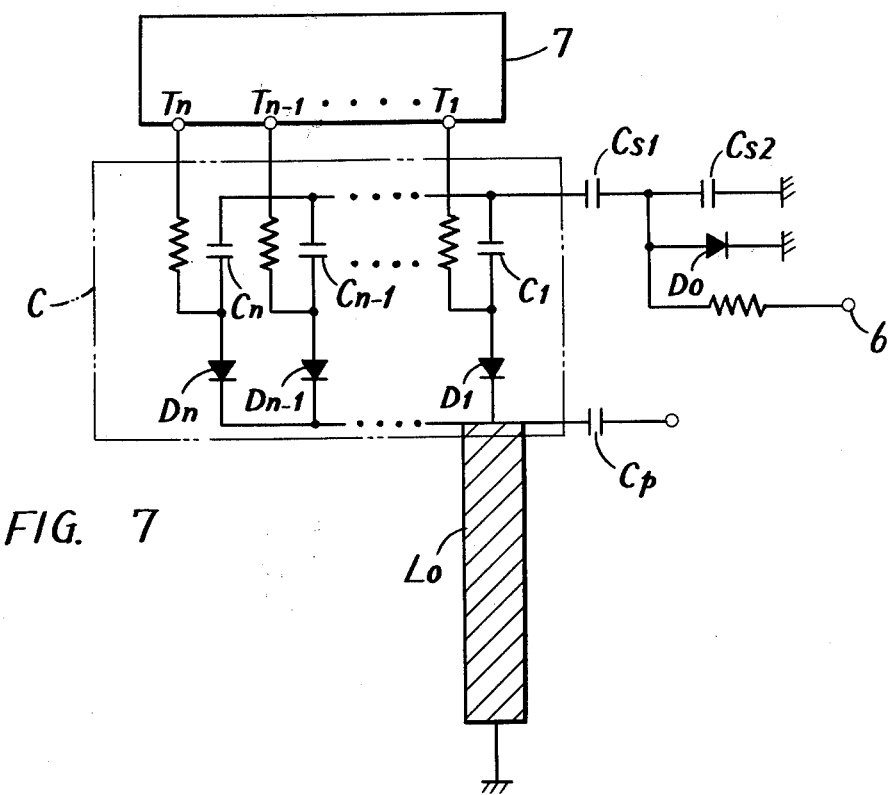
FIG. 7 is a schematic diagram of another embodiment of a ¼ wave length resonance type tuning circuit in a UHF application in accordance with the present invention.

FIG. 7 shows a schematic diagram of a ¼ wave length resonance type tuning circuit for a UHF application of another embodiment in accordance with the present invention. It is pointed out that the FIG. 7 diagram is similar to the FIG. 4 diagram, except for the following modifications. Therefore, only such modifications in the FIG. 7 embodiment will be described in the following. Although in the FIG. 4 embodiment one end of the resonant conductor L0 is grounded while the other end of the resonant conductor L0 is grounded though the above described variable capacitance device C and the fixed capacitor Cs, in the FIG. 7 embodiment the fixed capacitor Cs has been replaced by a series connection of capacitors Cs1 and Cs2. The junction of the capacitors Cs1 and Cs2 is connected to a switching diode D0 in the same manner as described in conjunction with the switching of the fixed capacitors C01 and C02 in the FIG. 6 embodiment.

Figure 8:
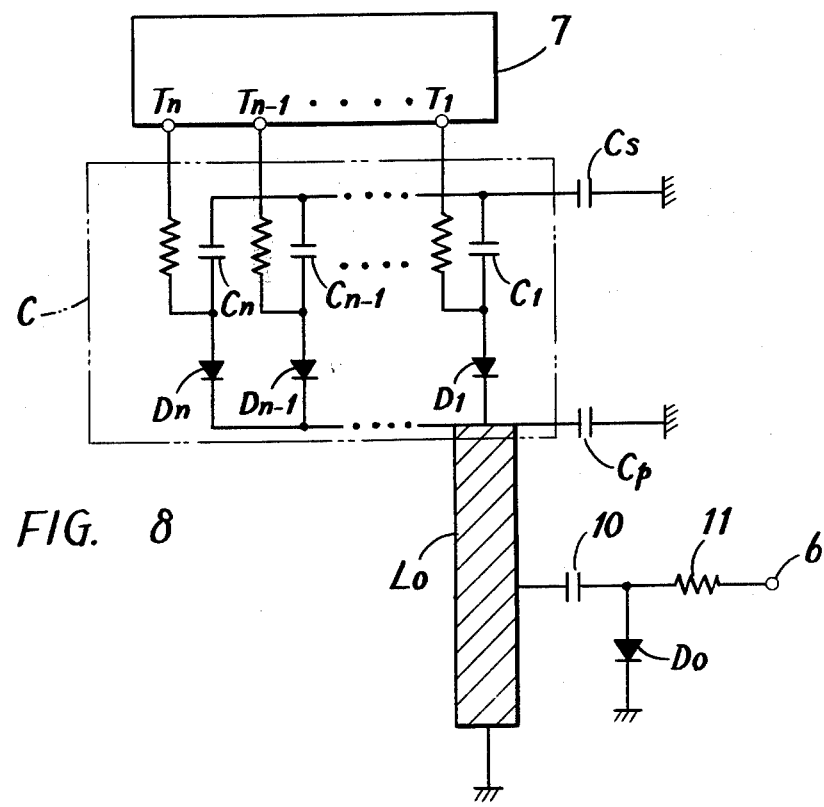
FIG. 8 is a schematic diagram of a further embodiment of a ¼ wave length resonance type tuning circuit in a UHF application in accordance with the present invention.

FIG. 8 is similar to FIG. 7 but shows a schematic diagram of a ¼ wave length resonance type tuning circuit of a further embodiment in accordance with the present invention. In the embodiment shown, the other end of the resonance conductor L0 is coupled though a series connection of the variable capacitance device C and the fixed capacitance Cs to the ground, as similar to the FIG. 4 embodiment. A feature to be noted in the embodiment shown is that the switching of the frequency regions is achieved by selectively switching the effective length of the resonance conductor L0, thereby to selectively switch the inductance value. To that end, a predetermined point on the resonance conductor L0, i.e., a point where the inductance values can be selectively switched for the higher and lower frequency regions, is determined and the said predetermined point is coupled through a series connection of a direct current blocking capacitor 10 and a switching diode D0 to the ground, while the junction between the capacitor 10 and the switching diode D0 is connected through a resistor 11 to a fixed inductance switching control terminal 6, such that a switching voltage is applied to the switching diode D0.

In the embodiment shown in FIGS. 6 through 8, the variable capacitance device C has been adapted such that the respective capacitance elements constituting the variable capacitance device may be the minimum capacitance unit to achieve a capacitance variation ΔC for the frequency deviation Δf and the fixed capacitance or fixed inductance is adapted to be switched for the respective frequency regions in order to make less strict the requirement of the minimum capacitance unit, i.e., the resolution. In the FIG. 6 embodiment, for example, as seen from the actual data shown in Table II, the capacitance variation for the frequency deviation ±0.5 MHz, i.e., the resolution was approximately 0.025 pF. However, as further seen in TAble II, the resolution of 0.025 pF is required in the relatively higher frequency region among the lower and higher frequency regions, while the resolution of only 0.1 pF though 0.13 pF is merely reqruied in the relatively lower frequency regions among the lower and higher frequency regions. Therefore, if the capacitance elements are classified or grouped to a capacitance element group which is responsible for the relatively lower frequency region and another capacitance device group which is responsible for a relatively higher frequency region, a much less number of capacitance elements may be of a high resolution, which enhance the yield. It is pointed out that the number two of the capacitance element groups should not be construed by way of limitation, inasmuch as the capacitance elements may be grouped into three or more groups.

Figure 9:
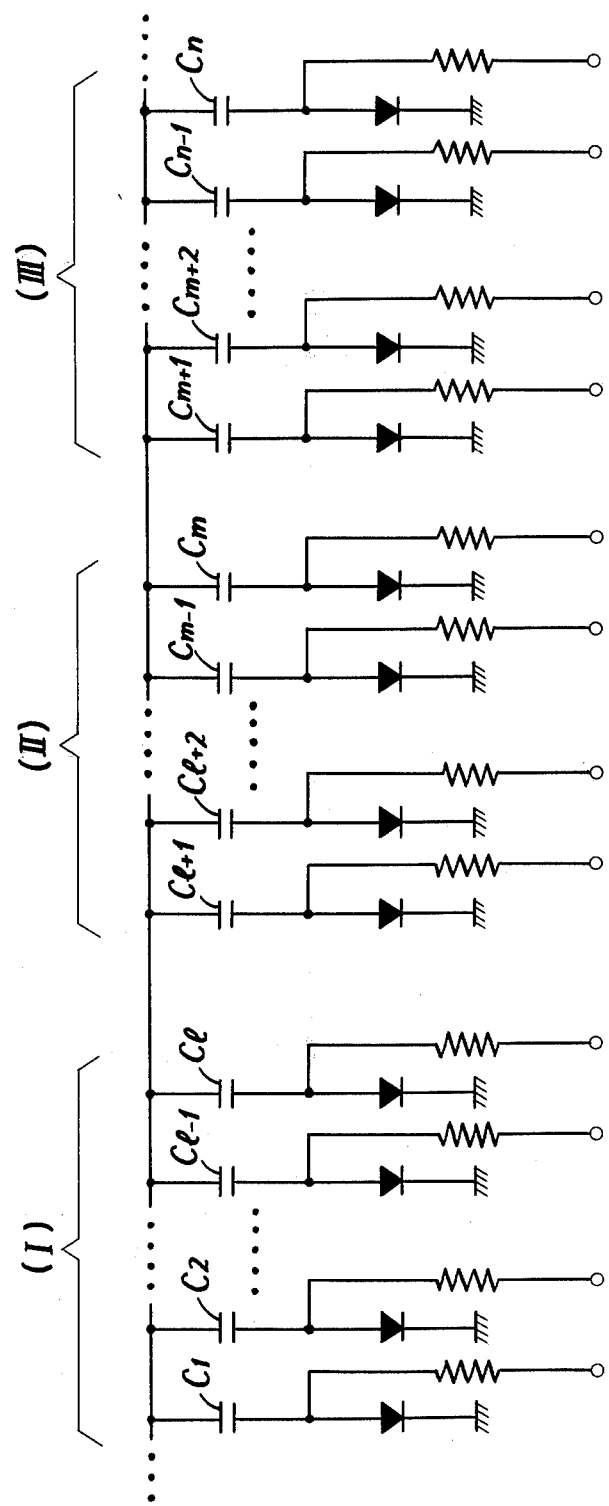
FIG. 9 is a schematic diagram of another embodiment of a variable capacitance device for use in the embodiment shown in FIG. 6 through 8.

FIG. 9 shows a schematic diagram of a variable capacitance device as grouped into three groups in accordance with the above described consideration. Referring to FIG. 9, among the plurality of tuning capacitance elements C1, C2, C3, ... Cn−1 and Cn, those capacitance elements, C1, C2, C3, ... Cl−1 and Cl are grouped in the first group I, those capacitance elements $C_l+1, C_l+2, C_l+3, \ldots C_m-1$ and $C_m$ are grouped in the second group II, and those capacitance elements $C_m+1, C_m+2, \ldots C_n-1$ and $C_n$ are grouped in the third group III, and the minimum capacitance elements $C_1$, $C_l+1$ and $C_m+1$ in the respective groups are selected to be of a capacitance value different from group to group and each of the remaining tuning capacitance elements in the respective groups is further selected to be of a capacitance value which is in a predetermined digital relation with the above described minimum capacitance elements $C_1$, $C_l+1$ and $C_m+1$, whereupon the desired group is selectively utilized responsive to a digital control signal depending on the frequency region to which a desired channel pertains. By way of an example, the first group I is allotted to a relatively lower frequency region, the second group II is allotted to a relatively intermediate frequency region and the third group III is allotted to a relatively higher frequency region. In such a situation, the minimum capacitance element $C_1$ of the first group I is selected to be 0.08 pF, the minimum capacitance element $C_l+1$ of the second group II is selected to be 0.04 pF and the minimum capacitance element $C_m+1$ of the third group III is selected to be 0.025 pF. The capacitance values of the remaining tuning capacitance elements in the respective groups I, II and III are selected in the relation to be described in the following.

As for the first group I, $$C_2 = 2C_1 = 2 \times 0.08 \text{pF}$$
$$C_3 = 4C_1 = 4 \times 0.08 \text{pF}$$
$$\vdots$$
$$C_l = 2^l C_1 = 2^l \times 0.08 \text{pF}$$

Similarly, as for the second group II, $$C_l + 2 = 2C_l + 1 = 2 \times 0.04 \text{pF}$$
$$C_l + 3 = 4C_l + 1 = 4 \times 0.04 \text{pF}$$
$$\vdots$$
$$C_m = 2(m-l) = 2(m-l) \times 0.04 \text{pF}$$

Further, as for the third group III, $$C_m + 2 = 2C_m + 1 = 2 \times 0.02 \text{pF}$$
$$C_m + 3 = 4C_m + 1 = 4 \times 0.02 \text{pF}$$
$$\vdots$$
$$C_n = 2(n-m) C_m + 1 = 2(n-m) \times 0.02 \text{pF}$$

It is pointed out that the FIG. 9 embodiment can be equally applicable not only to the FIG. 6 embodiment but also to the embodiments shown in FIGS. 7 and 8.

As apparent from the above described specific embodiment shown in FIG. 9, a much less number of capacitance elements having a relatively high resolution are only required, while the remaining capacitance elements may be of a lower resolution. This fact much facilitates fabrication of the variable capacitance device and enhances the yield. Furthermore, the number of capacitance elements constituting the variable capacitance device can be decreased as much as possible, with the result that the number of bits for channel selection is accordingly decreased.

As described in the foregoing, according to the present invention, the receiving frequency region is divided into a plurality of frequency regions such as a higher frequency region and a lower frequency region, whereupon a fixed reactance included in the tuning circuit, such as a fixed capacitance (as different from a variable capacitance) or a fixed inducatance is adapted to be switched among these frequency regions. As a result, the capacitance values of the respective capacitance elements constituting a variable capacitance device for channel selection can be selected to be a relatively large value, while a required total capacitance can be selected to be a relatively small value. As a result, a digital type channel selecting appratus can be achieved with ease. Such a variable capacitance device for channel selection can be fabricated by means of a thick film or thin film process.

Figure 1:
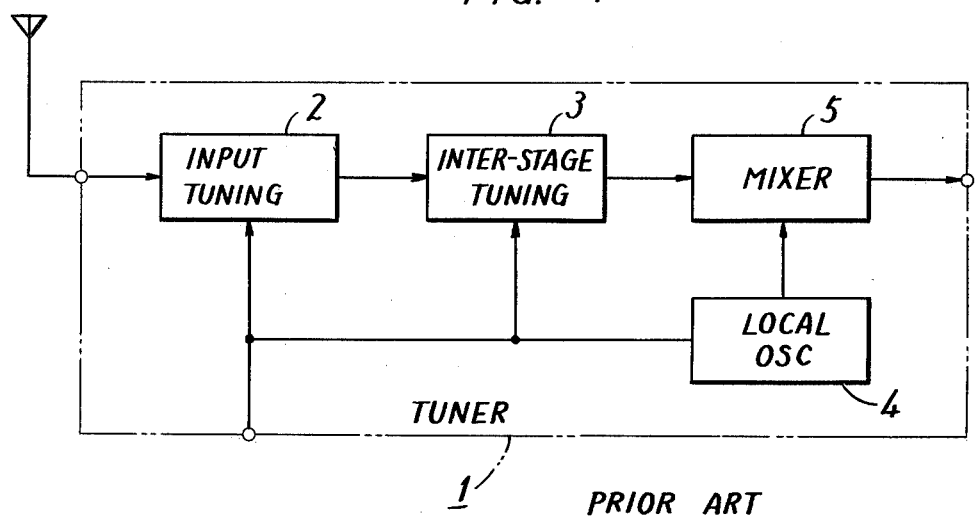
FIG. 1 is a block diagram showing an outline of a tuner or a channel selecting apparatus for use in a typical television receiver.
Figure 2:
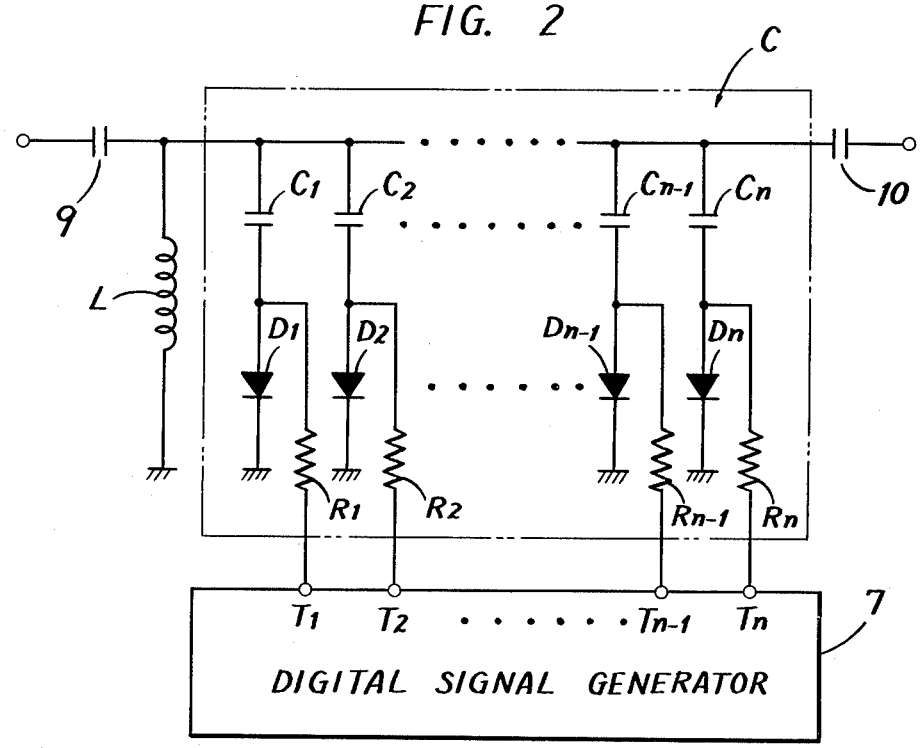
FIG. 2 is an example of a tuning circuit that constitutes the background of the invention and can be theoretically utilized in a VHF application.

It is pointed out that the above described tuning circuit can be advantageously employed in such a television tuner as shown in FIG. 1, particularly in the input tuning circuit 2, the inter-stage tuning circuit 3, and the local oscillator 4.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A digital channel selecting apparatus for selecting a channel among a plurality of television channels which are distributed in at least a relatively higher and lower frequency regions, comprising:
   tuning circuit means including a reactance component consisting of a fixed reactance component and a variable reactance component,
   automatic frequency control means coupled to said tuning circuit for correcting frequency deviations therein, said automatic frequency control means having a predetermined maximum frequency correction,
   said variable reactance component including a plurality of capacitance elements coupled in parallel with each other,
   a plurality of switching means individually coupled to said plurality of capacitance elements for coupling parallel combinations of said capacitance elements into said tuning circuit means, wherein the minimum difference between the value of said combinations of said capacitance elements is less than the capacitive value which produces the predetermined maximum frequency correction of said automatic frequency control means,
   selection circuit means for generating a coded digital control signal for selectively enabling at least one of said plurality of switching means to thereby tune said tuning circuit means by selectively coupling into said tuning circuit means at least one of said plurality of capacitance elements corresponding to the channel being selected, and
   means for varying the reactance value of said fixed reactance component in said tuning circuit means for switching said tuning circuit means between said higher and lower frequency regions.

2. A digital channel selecting apparatus in accordance with claim 1, wherein the capacitance values of said plurality of capacitance elements are weighted in a predetermined relation.

3. A digital channel selecting apparatus in accordance with claim 1, wherein the capacitance values of said plurality of capacitance elements are equal.

4. A digital channel selecting apparatus in accordance with claim 1, wherein said fixed reactance component comprises at least two capacitance elements, and
said fixed reactance value varying means comprises switching means coupled to said at least two capacitance elements for selectively coupling said at least two capacitance elements into said tuning circuit means.

5. A digital channel selecting apparatus in accordance with claim 1, wherein such fixed reactance component comprises at least two inductance elements, and
said fixed reactance value varying means comprises switching means coupled to said at least two inductance elements for selectively coupling said at least two inductance elements into said tuning circuit means.

6. A digital channel selecting apparatus in accordance with claim 1, wherein said fixed reactance component comprises at least two reactance elements, and
said fixed reactance varying means comprises switching means operatively coupled to said at least two reactance elements for selectively coupling said at least two reactance elements to said tuning circuit means through selective conduction of said switching means.

7. A digital channel selecting apparatus in accordance with claim 1, wherein said plurality of switching means each comprise
diode switching means operatively coupled to said plurality of capacitance elements, and
biasing means operatively coupled to said diode switching means for selectively rendering conductive said diode switching means.

8. A digital channel selecting apparatus in accordance with claim 1, wherein said tuning circuit means comprises a UHF tuning circuit means for use in a television receiver.

9. A digital channel selecting apparatus in accordance with claim 8, wherein said fixed reactance component of said tuning circuit means comprises a resonance conductor member.

10. A digital channel selecting apparatus in accordance with claim 9, wherein one end of said resonance conductor member is coupled to ground through said variable reactance component including said plurality of capacitance elements.

11. A digital channel selecting apparatus in accordance with claim 10, wherein
said fixed reactance component comprises at least two capacitance elements,
said fixed reactance value varying means comprises switching means operatively coupled to said at least two capacitance elements of said fixed reactance component for selectively coupling said at least two capacitance elements of said fixed reactance component into said tuning circuit means, and
the other end of said resonance conductor member is coupled to said at least two capacitance elements of said fixed reactance component.

12. A digital channel selecting apparatus in accordance with claim 9, wherein one end of said resonance conductor member is coupled to ground.

13. A digital channel selecting apparatus in accordance with claim 12, wherein the other end of said resonance conductor member is coupled to said plurality of capacitance elements of said variable reactance component.

14. A digital channel selecting apparatus in accordance with claim 13, wherein
said fixed reactance component comprises at least two capacitance elements, and
said fixed reactance value varying means comprises switching means operatively coupled to said at least two capacitance elements of said fixed reactance component for selectively coupling said at least two capacitance elements of said fixed reactance component into said tuning circuit means for varying said fixed reactance value.

15. A digital channel selecting apparatus in accordance with claim 13, wherein said resonance conductor member comprises at least two resonance conductor member portions, and
said fixed reactance value varying means comprises switching means operatively coupled to said at least two resonance conductor member portions for selectively coupling said at least two resonance conductor member portions of said resonance conductor member into said tuning circuit means for varying said fixed reactance value.

16. A digital channel selecting apparatus in accordance with claim 1, wherein said plurality of capacitance elements of said variable reactance component are grouped into at least two groups, each group being responsible for the respective frequency regions, and
wherein the capacitance values of the minimum tuning capacitance elements of the respective groups are selected to be different from group to group.

17. A digital channel selecting apparatus in accordance with claim 16, wherein the remaining capacitance elements other than the said minimum tuning capacitance elements of the respective groups are selected to be in a predetermined digital relation with said minimum tuning capacitance elements.

* * * * *